July 25, 1961 O. J. OTT 2,994,043

F-M OSCILLATOR CIRCUIT ARRANGEMENTS

Filed Jan. 25, 1960 2 Sheets-Sheet 1

INVENTOR.
OWEN J. OTT

BY

Kenyon & Kenyon

ATTORNEYS

July 25, 1961 O. J. OTT 2,994,043

F-M OSCILLATOR CIRCUIT ARRANGEMENTS

Filed Jan. 25, 1960 2 Sheets-Sheet 2

INVENTOR.
OWEN J. OTT

BY Kenyon & Kenyon
ATTORNEYS

United States Patent Office 2,994,043

Patented July 25, 1961

2,994,043

F-M OSCILLATOR CIRCUIT ARRANGEMENTS

Owen J. Ott, Brookfield, Conn., assignor to Data-Control Systems, Inc., Danbury, Conn., a corporation of Delaware Filed Jan. 25, 1960, Ser. No. 4,544
5 Claims. (Cl. 332—16)

The present invention relates generally to frequency-modulation (F-M) systems, and more particularly to an improved F-M oscillator circuit arrangement of highly stable design, the generated wave being substantially free of amplitude distortion.

The carrier wave generated by an oscillator in an F-M system is caused by the modulating signal to be systematically varied above and below the carrier frequency value. The extent of variation or swing is controlled by the amplitude of the modulating signal, while the repetition rate of the variation is determined by the signal frequency. Variations of the carrier frequency produce additional frequency components or sidebands which lie both above and below the unmodulated carrier frequency.

Ideally, the power contained in the carrier and in the sideband components is a constant value. However, with F-M oscillators of the type heretofore known, power variations or amplitude modulation effects will accompany the frequency modulation and result in signal distortion.

Another serious drawback encountered in conventional F-M oscillators is instability due to temperature changes, severe mechanical shocks, deviations in supply potential and variations in operating characteristics. Such instabilities give rise to spurious variations in frequency and consequently in the transmission of false intelligence. Where for example F-M oscillators form part of a telemetering network, the amplitude modulation effects and functional instabilities produce unreliable and inaccurate operations.

Accordingly it is the major object of this invention to provide an F-M oscillator circuit arrangement of highly stable design, the arrangement being adapted to generate a frequency-modulated wave whose amplitude is substantially constant.

A significant feature of the invention is that it is insensitive to environmental conditions and is not subject to fluctuations in supply voltage or to variations in the characteristics of amplifiers included therein.

Also an object of the invention is to provide a stable F-M oscillator circuit which is efficient and reliable in operation, and yet is of relatively simple design, whereby the oscillator circuit may be manufactured at low cost.

Briefly stated, in an F-M oscillator circuit, in accordance with the invention, the carrier wave is generated by a resonant circuit and a limiter amplifier regeneratively coupled thereto to sustain amplitude-limited carrier oscillations which are supplied to a diode modulator to which is also applied a modulating signal. The modulating signal acts to amplitude-modulate the applied carrier wave in the diode modulator and thereby to produce an amplitude-modulated wave which is fed back to the resonant circuit so as to effect frequency-modulation of the carrier wave circulating therein.

For a better understanding of the invention as well as other objects and further features thereof, reference is made to the following detailed description to be read in connection with the accompanying drawing, wherein like components in the several figures are identified by like reference numerals.

*Basic oscillator*

Figure 1:
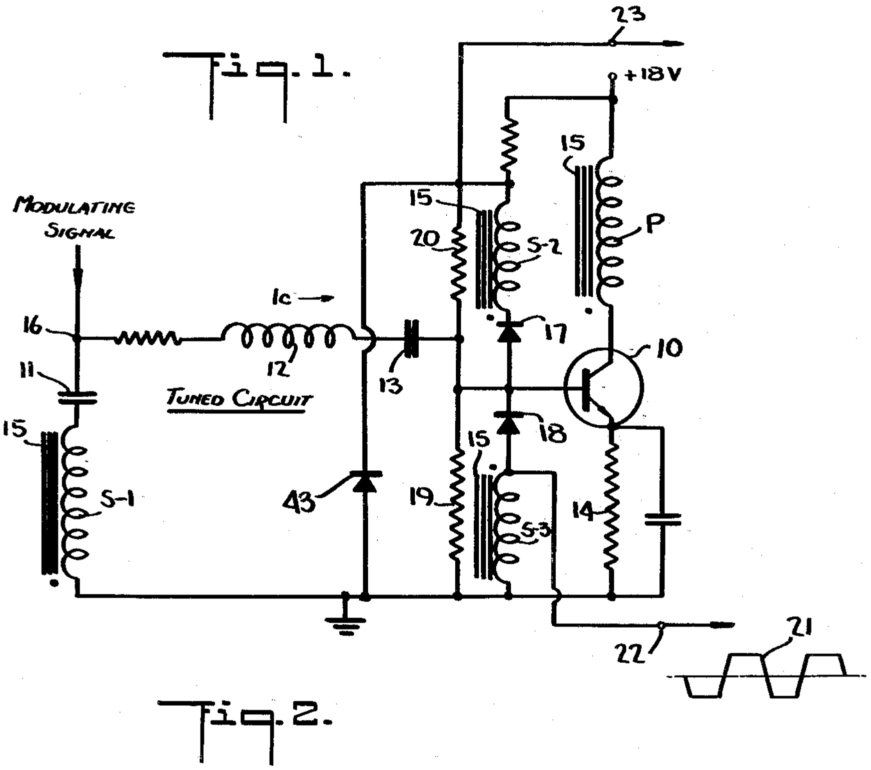
FIG. 1 is a schematic diagram of the basic oscillator in accordance with the invention.

Referring now to the drawings and more particularly to FIG. 1, the basic oscillator comprises a limiting amplifier including a transistor 10, the amplifier being regeneratively coupled to a series-resonant circuit formed by a condenser 11 and an inductor 12.

Inductor 12 is coupled to the base of transistor 10 through a capacitor 13. The emitter of the transistor 10 is connected to ground (negative terminal of supply) through an R-C bias network 14, and the collector is connected to the positive terminal of the supply through the primary P of an output transformer 15 having a low impedance secondary winding S–1 connected between the condenser 11 and ground. Thus the amplifier is in positive feedback relation to the series-tuned circuit.

When the gain of the amplifier including transistor 10 is made to have an overall gain in excess of unity, a circulating current will flow at a carrier frequency determined by the series resonant circuit 11, 12. A modulating current is applied at terminal 16 which is the junction between the resistance and capacitance components of the tuned circuit.

If the modulating current is at the same frequency as the carrier current and in phase coincidence or in phase opposition thereto, it will shift the circulating carrier phase and hence the frequency to an extent determined by the ratio of the modulating current to the carrier current.

When the overall gain of the amplifier circuit exceeds unity, the amplitude of oscillations in the circuit tends to increase exponentially. In order to limit the amplitude to a prescribed level, the transformer 15 includes two additional secondaries $S_2$ and $S_3$. The secondary winding $S_2$ is connected between a positive terminal of the supply and the base of transistor 10 through diode 17, the secondary winding being connected between ground and the transistor base through a diode 18. The cathodes of diodes 17 and 18 are back biased relative to their anodes by resistors 19 and 20 connected to the supply voltage.

The phasing of secondary windings $S_2$ and $S_3$ is such that after the back bias on the associated diodes 17 and 18 is overcome, the resultant conduction through the diodes prevents further gain in the amplifier. Secondaries $S_2$ and $S_3$ act respectively with reference to alternate half cycles of the carrier wave so as to provide an uninterrupted limiting action.

Proper choice of circuit components maintains substantial linear operation of the transistor amplifier at all times. The limiting action flattens the tops of the sinusoidal carrier and results in a square wave drive signal at the tuned circuit. If, however, the resonance of the tuned circuit is of fairly high "Q," the natural frequency of the system is that of the tuned circuit. As long as the gain of the transistor amplifier is well in excess of that necessary to sustain oscillations, the magnitude of the gain is not a significant determining factor in the performance of the circuit.

Hence variations in gain as a consequence of supply voltage variations, or changes in transistor characteristics due to rising and falling ambient temperatures will not alter the constant amplitude of the carrier wave. Stability of the bias voltage for diodes 17 and 18 is secured by means of voltage regulating "avalanche" diode 43. The carrier output 21 may be derived from terminal 22 connected to secondary winding $S_3$.

*Diode modulator*

Figure 2:
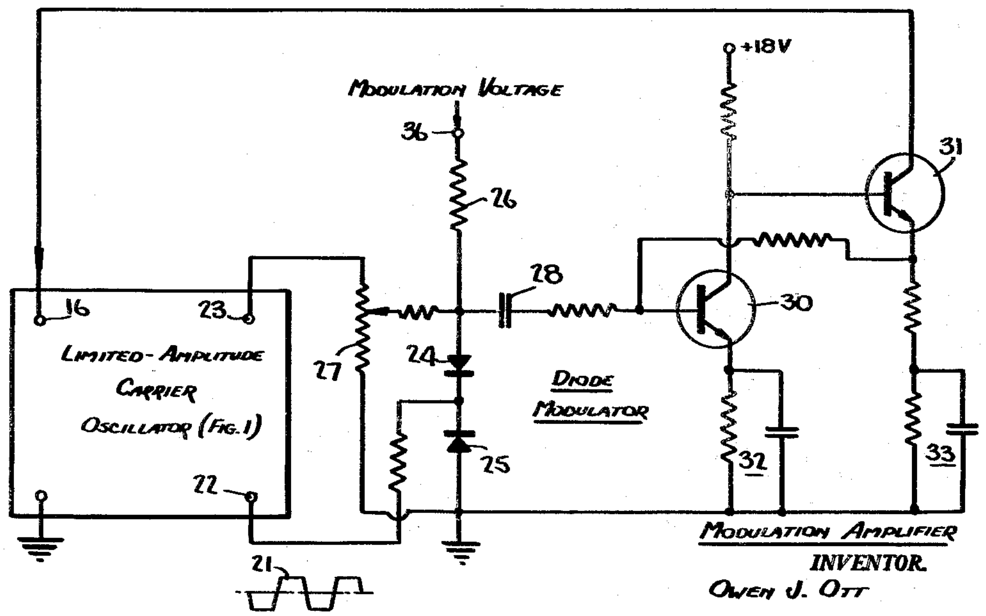
FIG. 2 is a schematic diagram showing the basic oscillator in combination with a diode switch modulator and carrier amplifier.

Referring now to FIG. 2, there is shown the diode modulator and its operative relation to the amplitude limited oscillator shown in FIG. 1. The diode modulator comprises diodes 24 and 25 serially-connected in opposition between ground and a modulation voltage source through a resistor 26. The carrier wave from terminal 22 is applied to the junction of the diodes 24 and 25 and the fixed potential from terminal 23 is applied through an adjustable potentiometer 27 to the junction of diode 24 and resistor 26. The function of potentiometer 27 is to permit fine adjustment of the operating frequency of the oscillator. The carrier wave yielded at terminal 22 is applied to the junction of diodes 24 and 25, rendering them conducting and non-conducting on alternate half cycles of modulating wave 21. When, during negative half cycles of wave 21, both diodes are conducting, the junction of resistor 26 and diode 24 is virtually grounded. During positive half cycles of the modulating wave 21 this point is isolated from ground.

The junction of resistor 26 and diode 24 is coupled through capacitor 28 and resistor 29 to the base of a first transistor 30 in a two-stage modulation amplifier, the collector of transistor 30 being connected to the base of a second transistor 31. The emitter of transistor 30 is connected through an R-C bias network 32 to ground and the emitter of transistor 31 is similarly biased by an R-C network 33. The output of the two-stage amplifier is taken from the collector of transistor 31 and is applied to terminal 16 of the amplitude limited carrier oscillator where it is fed to the junction of the condenser and inductor in the series resonant circuit therein.

In operation, the input to transistor 30 is effectively connected to ground through series-connected diodes 24 and 25 only when these diodes are rendered conductive during one-half cycle of the applied carrier wave. During the succeeding half cycle, the diodes are non-conductive, hence the modulating intelligence voltage applied at terminal 36 is effective at the base of the transistor 30 and amplification thereof occurs.

Thus the signal appearing at the anode of diode 24 is at ground potential during half cycles of the carrier and is determined by the instantaneous level of the modulating voltage during alternate half cycles. Applied therefore to the transistor 30 of the modulation amplifier is a square wave at the oscillator frequency, the square wave having an amplitude determined by the magnitude of the input signal.

Yielded at the output of transistor 31 is an amplitude-modulated square wave of the same frequency as the carrier wave. This amplitude-modulated square wave is applied at terminal 16 to the tuned circuit of the oscillator in positive or negative phase quadrature to the carrier current therein. The ratio between the current applied to the oscillator and the circulating current in the oscillator is determined by the amplitude of the applied current and varies accordingly.

As the ratio varies, the phase of the circulating current in the oscillator is correspondingly varied to produce frequency-modulation as a function of the modulating voltage. But this frequency-modulation is not accompanied by amplitude-modulation, since the limiting action in the oscillator circuit stabilizes the amplitude of the carrier. Such stabilization is maintained under severe ambient conditions.

*Practical circuit embodiment*

Figure 3:
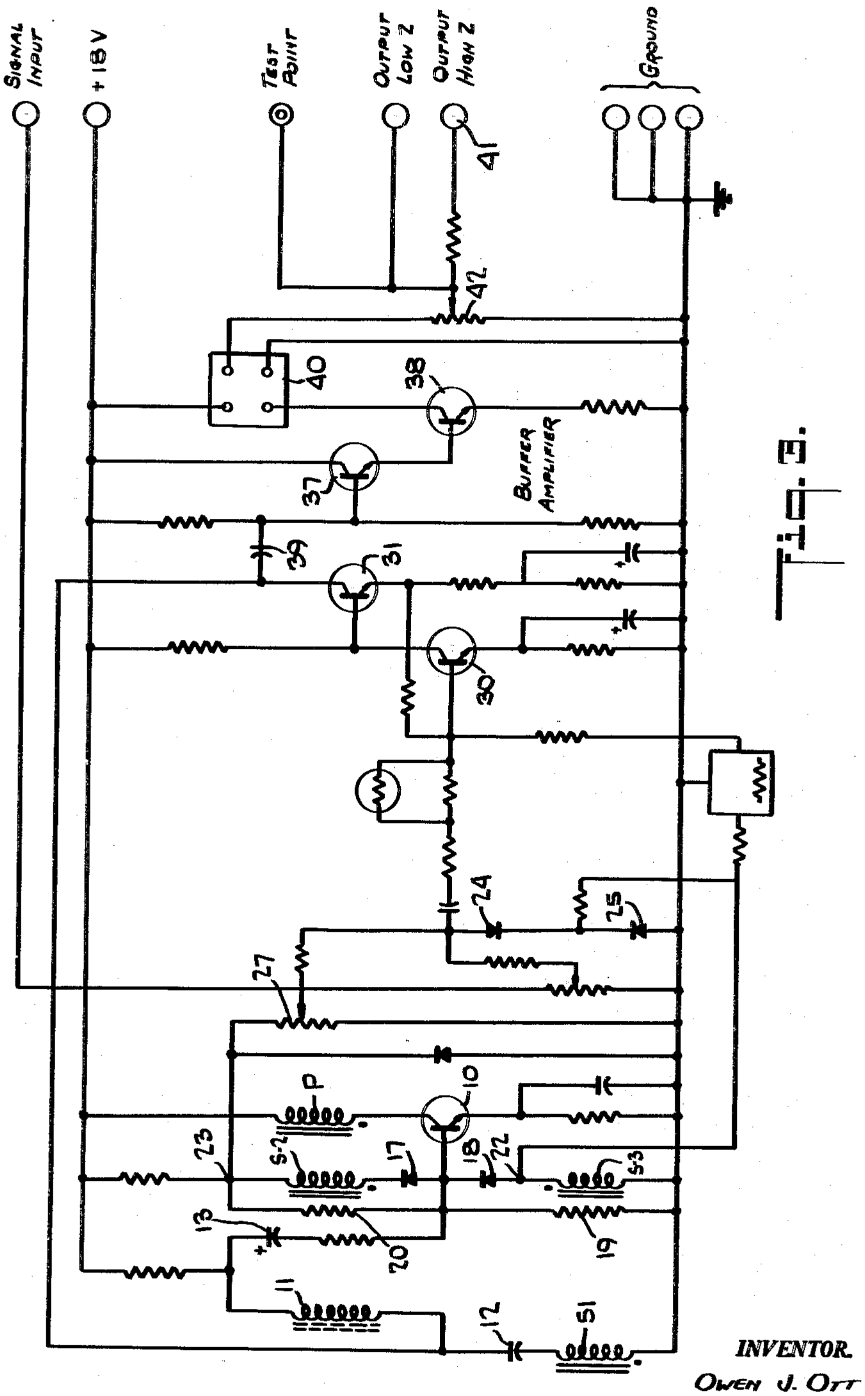
FIG. 3 is a schematic diagram of a practical embodiment of the invention.

In the actual working circuit shown in FIG. 3, the arrangement is essentially a combination of the circuits illustrated in FIGS. 1 and 2. Thus the oscillator includes the tuned circuit formed by inductor 11 and capacitor 12 and the limiting amplifier including transistor 11 and diodes 17 and 18.

The carrier is applied to a diode modulator including diodes 24 and 25, and the modulating amplifier includes transistors 30 and 31.

The output of the circuit is taken from the second stage 31 of the modulating amplifier through an isolation or buffer amplifier having a transistor 37 whose base is coupled by capacitor 39 to the collector of transistor 31. The buffer amplifier 37 is coupled to a final amplifier including transistor 38 whose output is fed through a suitable output filter 40 to the output terminal 41, the output level being adjustable by potentiometer 42.

While there has been shown what is considered to be a preferred embodiment of the invention, it is to be understood that many changes and modifications may be made therein without departing from the essential features of the invention. For example, an oscillator circuit employing parallel resonance may be used if the modulation signal is placed in series with the capacitance of the tuned circuit. The use of negative resistance semiconductor devices is feasible in place of the transistor-transformer combination disclosed herein. Circuits having the inductance and capacitance interchanged may be used to provide some forms of non-linear relationship between modulation signal and frequency.

It is intended therefore in the annexed claims to cover all such changes and modifications as fall within the true spirit of the invention.

What is claimed is:

1. An amplitude-limited carrier oscillator comprising a tuned circuit formed by a condenser in series with an inductor, an amplifier including a transistor having an input electrode connected to the free end of said inductor, a transformer having a primary and a secondary, said primary being connected to an output electrode of said transistor and said secondary being connected to the free end of said capacitor whereby said amplifier is regeneratively coupled to the tuned circuit, and means coupled to said input electrode to limit the gain of said amplifier.

2. An amplitude-limited carrier oscillator, as set forth in claim 1, wherein said limit means includes two additional secondaries on said transformer, and a pair of diodes, each additional secondary being connected through one of said diodes to said input electrode.

3. An amplitude-limited carrier oscillator, as set forth in claim 1, further including means to apply an amplitude modulated wave having the same frequency as said carrier to the junction of said condenser and inductor to frequency modulate said carrier.

4. Apparatus to produce a frequency-modulated carrier comprising a series-resonant circuit establishing the carrier frequency, a limiting amplifier regeneratively coupled to said series resonant circuit to produce carrier oscillations therein and having an output transformer with one secondary for the regenerative coupling said amplifier to said resonant circuit and a second and third secondary for coupling a portion of the carrier oscillations to a diode limiting circuit connected to the input of said limiting amplifier, a diode modulator to which a portion of the carrier oscillations from said second and third secondaries is coupled and also to which a modulating signal is applied in such a manner as to produce a resultant wave at the oscillator frequency having an amplitude determined by the instantaneous level of said modulating signal, and a modulation amplifier whose input is connected to the output of said diode modulator and having its output applied to said series resonant circuit to frequency-modulate the carrier frequency thereof.

5. An apparatus providing a frequency-modulated carrier comprising a series-resonant circuit establishing the carrier frequency, an amplifier regeneratively connected to said series-resonant circuit to produce oscillations therein and including a transistor in a grounded emitter configuration and having an output transformer having a primary winding in the collector circuit of said transistor, with one secondary winding of said output transformer inserted in series with said series-resonant circuit and said output transformer having second and third secondary windings, a limiting circuit constituted by a pair of diodes connected to the base circuit of said amplifier and being each supplied with a portion of said amplifier output from said second and third secondary windings, a diode-modulator having a portion of said amplifier output connected from said second and third secondary windings to its input and also being responsive to a modulating signal to produce an amplitude-modulated wave, a modulation amplifier constituted by two transistors in series having each a grounded emitter configuration and being supplied from the output of said diode-modulator and having its output applied to a point between the coil and capacitor of said series-resonant circuit, and a carrier amplifier whose input is supplied from said point between the coil and capacitor of said series-resonant circuit and including two transistors in cascade and having its output available for external use.

References Cited in the file of this patent

FOREIGN PATENTS 1,013,330 Germany ---------------- Aug. 8, 1957